United States Patent
Wang et al.

(10) Patent No.: US 7,532,077 B2
(45) Date of Patent: May 12, 2009

(54) EDGE ALIGNMENT FOR FREQUENCY SYNTHESIZERS

(75) Inventors: Stanley Wang, Cupertino, CA (US); Thomas H. Lee, Burlingame, CA (US)

(73) Assignee: ZeroG Wireless, Inc., Sunnyvale, CA (US)

( * ) Notice: Subject to any disclaimer, the term of this patent is extended or adjusted under 35 U.S.C. 154(b) by 112 days.

(21) Appl. No.: 11/801,199

(22) Filed: May 8, 2007

(65) Prior Publication Data

US 2008/0278243 A1 Nov. 13, 2008

(51) Int. Cl.
 *H03L 7/00* (2006.01)
(52) U.S. Cl. .................... 331/1 A; 331/16; 331/34; 327/115; 327/156; 377/47
(58) Field of Classification Search .............. 331/1 A, 331/25, 16, 34; 327/156, 115; 377/47
See application file for complete search history.

(56) References Cited

U.S. PATENT DOCUMENTS 5,202,906 A * 4/1993 Saito et al. .................... 331/14
6,222,240 B1 * 4/2001 Gardner et al. .............. 257/410

OTHER PUBLICATIONS

IEEE Transactions on Communications, vol. COM-28, No. 11, Nov. 1980, "Charge-Pump Phase-Lock Loops," Floyd M. Gardner, Fellow, IEEE, pp. 1849-1858.

* cited by examiner

*Primary Examiner*—Arnold Kinkead
(74) *Attorney, Agent, or Firm*—The Mueller Law Office, P.C.

(57) ABSTRACT

A frequency synthesizer (50, 70) including an edge-detection circuit (51, 60) for disabling elements of the frequency synthesizer (50, 70) prior to start-up. The edge-detection circuit detects a transition edge of a reference-clock signal (ref_clk) of the frequency synthesizer (50, 70) and enables elements of the frequency synthesizer (50, 70) upon the detection of the transition edge.

16 Claims, 5 Drawing Sheets

50

EDGE ALIGNMENT FOR FREQUENCY SYNTHESIZERS

FIELD OF THE INVENTION

The invention relates generally to frequency synthesizers, and more specifically to reducing the phase-locking time of frequency synthesizers through edge alignment.

BACKGROUND OF THE INVENTION

Frequency synthesizers have a wide range of applications, including wide-band communication systems and information-processing systems. As the speed and power requirements of these applications become more demanding, it is increasingly important that frequency synthesizers are capable of a fast locking time. Locking time is an important performance metric of a frequency synthesizer, because a long locking time means longer start-up times and greater start-up power consumption. The locking time of a frequency synthesizer is essentially the amount of time that it takes, after the loop of the frequency synthesizer has been enabled, for the local oscillator signal to settle to within a certain percentage of the steady-state frequency. Prior-art frequency synthesizers generally start operation by closing the loop at a random moment. As a result, the locking time of prior-art frequency synthesizers varies randomly and can be at times relatively long. The duration of the locking time also depends on parameters of many of the elements of the frequency synthesizer, including the frequency of the reference-clock signal, the current of the charge pump, the gain of the voltage-controlled oscillator, the order of the loop filter, the bandwidth of the loop and the frequency-divide ratio of the frequency divider. Prior art efforts at minimizing locking time have primarily focused on optimizing these parameters. A need remains for improved techniques for minimizing the locking time of frequency synthesizers.

SUMMARY OF THE INVENTION

In one aspect of the invention, a method is provided for starting a frequency synthesizer. The method comprises the steps of (a) disabling elements of the frequency synthesizer prior to starting the frequency synthesizer; (b) detecting a transition edge of a reference-clock signal of the frequency synthesizer; and (c) enabling elements of the frequency synthesizer substantially upon detection of the transition edge.

In another aspect of the invention, a frequency synthesizer is provided. The frequency synthesizer includes (a) means for disabling elements of the frequency synthesizer prior to starting the frequency synthesizer; (b) means for detecting a transition edge of a reference-clock signal of the frequency synthesizer; and (c) means for enabling elements of the frequency synthesizer substantially upon detection of the transition edge.

In another aspect of the invention, an information-processing system is provided. The information-processing system includes a frequency synthesizer having a phase-locked loop; and an edge-detect circuit for (a) disabling elements of the phase-locked loop prior to starting the frequency synthesizer; (b) detecting a transition edge of a reference-clock signal of the frequency synthesizer; and (c) enabling elements of the phase-locked loop of the frequency synthesizer substantially upon detection of the transition edge.

DETAILED DESCRIPTION

Reference now will be made in detail to embodiments of the disclosed invention, one or more examples of which are illustrated in the accompanying drawings. Each example is provided by way of explanation of the present technology, not limitation of the present technology. In fact, it will be apparent to those skilled in the art that modifications and variations can be made in the present technology without departing from the spirit and scope thereof. For instance, features illustrated or described as part of one embodiment may be used on another embodiment to yield a still further embodiment. Thus, it is intended that the present subject matter covers such modifications and variations as come within the scope of the appended claims and their equivalents.

Figure 1:
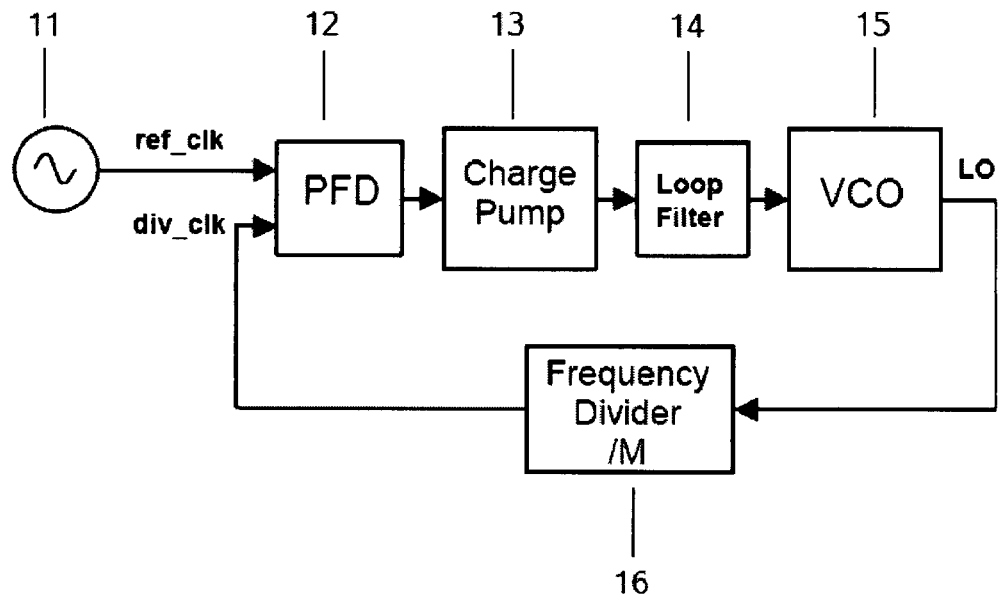
FIG. 1 illustrates an example of a prior-art frequency synthesizer that is suitable for use with methods and systems of the present invention.

FIG. 1 illustrates a prior-art frequency synthesizer 10 that is suitable for use with methods and systems of the present invention. The frequency synthesizer 10 includes a source 11, a phase-frequency detector (PFD) 12, a charge pump 13, a loop filter 14, a voltage-controlled oscillator (VCO) 15 and a frequency divider 16. The frequency synthesizer 10 is essentially a loop that generates a high-frequency local oscillator (LO) signal from a stable, low-frequency reference-clock signal (ref_clk). The source 11 of the ref_clk signal may be, for example, a crystal oscillator. During the initialization of the frequency synthesizer 10, the frequency of the LO signal is divided by a factor of M by the frequency divider 16 to produce a divided-clock signal (div_clk). The div_clk signal is compared to the ref_clk signal by the PFD 12. A phase difference between the ref_clk and div_clk signals causes a non-zero duration digital pulse from the PFD 12. This digital pulse in turn generates an analog current or voltage pulse from the charge pump 13. This current or voltage is then filtered by the loop filter 14 and shifts the tuning voltage of the VCO 15. Once the loop of the frequency synthesizer 10 is settled, the div_clk and ref_clk signals are phase locked, and the frequency of the LO signal is substantially equal to M times the frequency of the ref_clk and div_clk signals. If the frequency synthesizer 10 is initialized and its loop is closed at a random moment in time, an initial phase difference may exist between the ref_clk signal and the div_clk signal. This difference can cause slewing in the VCO 15 of the frequency synthesizer 10 and can significantly increase the locking time of the frequency synthesizer 10.

Figure 2:
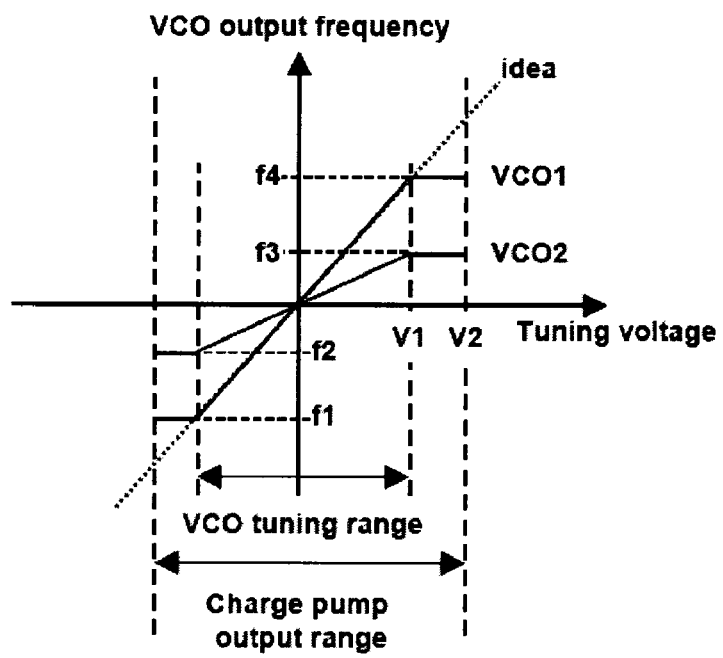
FIG. 2 illustrates transfer functions for two prior-art voltage-controlled oscillators.

FIG. 2 illustrates the transfer functions of two typical prior-art VCOs. Linear operation of the frequency synthesizers is achieved via a large VCO gain and/or tuning range. The transfer function labeled VCO1 corresponds to a first VCO (VCO1). The transfer function labeled VCO2 corresponds to a second VCO (VCO2). The gain of VCO1 is greater than the gain of VCO2. As a result, the range of output frequencies that VCO1 can cover is greater than the range that VCO2 can cover. This is illustrated in the figure by the four frequencies f1 through f4. VCO1 can handle a frequency range of f1 to f4, while VCO2 can only handle a frequency range of f2 to f3. Unfortunately, as the gain of a VCO is increased, a frequency synthesizer becomes more susceptible to noise from the supply and substrate. As a result, the gain of a VCO needs to remain low to avoid phase noise and spectral spur increment. In addition, the advancement of the semiconductor technology, especially for complementary metal-oxide-semiconductors (CMOS), consistently lowers supply voltages. This leads to shrinkage of the charge pump output range. It is thus possible that the output range of the charge pump (V2) is smaller than the tuning range of the VCO (V1), which further suppresses the linear operating range of the VCO.

Figure 3:
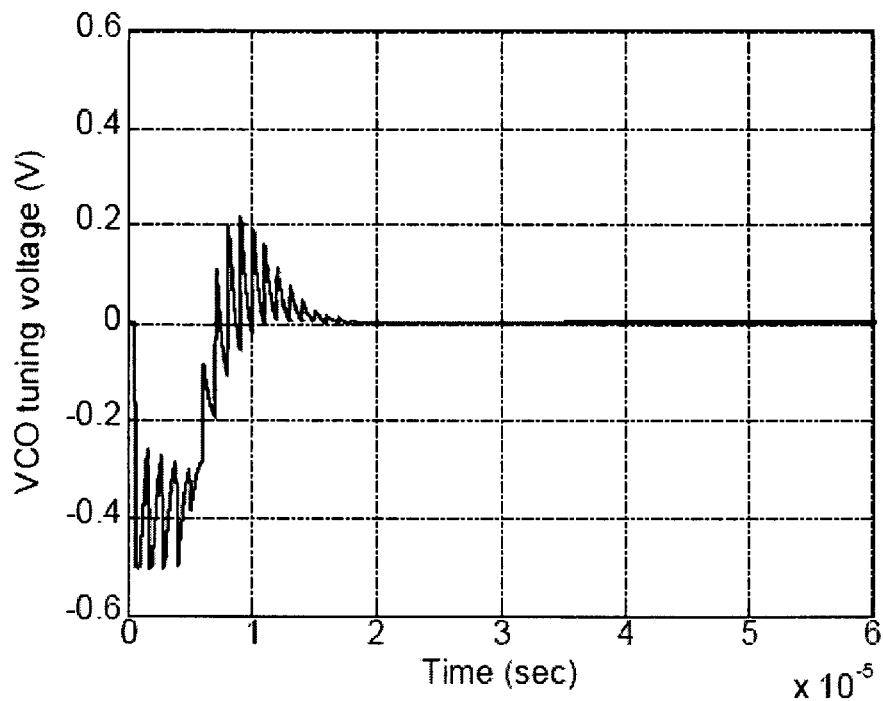
FIG. 3 illustrates the locking-transient waveform of a frequency synthesizer with a voltage-controlled oscillator having a gain of 300 MHz/V.
Figure 4:
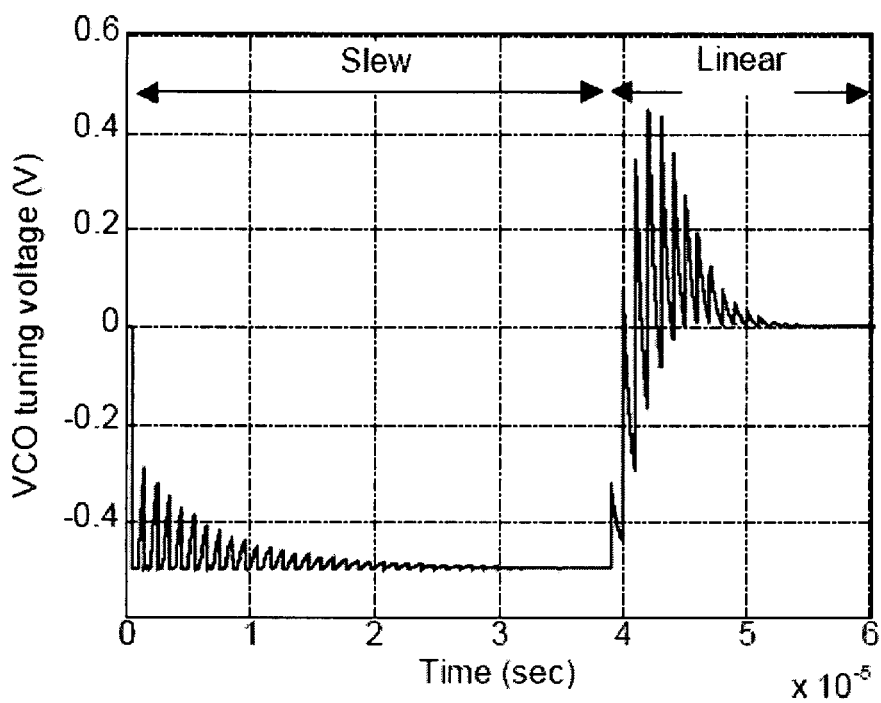
FIG. 4 illustrates the locking-transient waveform of a frequency synthesizer with a voltage-controlled oscillator having a gain of 30 MHz/V.

The influence of the VCO gain and stewing on locking time is illustrated in FIGS. 3 and 4. FIG. 3 illustrates the locking-transient waveform of a frequency synthesizer with a VCO gain of 300 MHz/V. FIG. 4 illustrates the locking-transient waveform of a frequency synthesizer with a VCO gain of 30 MHz/V. The following parameters of the frequency synthesizers illustrated in FIGS. 3 and 4 are the same: (i) reference-clock frequency=1 MHz, (ii) loop bandwidth=90 KHz, (iii) loop-filter order=3, (iv) frequency-divide ratio=1000, (v) when the tuning voltage equals 0, local-oscillator frequency=1 GHz. The charge-pump current, however, is changed according to gain of the VCO in order to keep the same loop gain. In both FIGS. 3 and 4, the phase difference between the ref_clk and div_clk signals is 180 degrees (0.5 µs). Under these parameters, the two frequency synthesizers should have the same locking time, if their VCOs are linear. However, given a VCO-linear operating range of −0.5V to 0.5 V and a VCO-tuning voltage=−0.5V, there exists a time period in which the frequency synthesizer of FIG. 4 operates in the saturation region and slewing occurs. When the gain of the VCO is small, the slew rate is smaller (30 MHz/V*−0.5V=−15 MHz). As a result, it takes longer for the div_clk signal to catch up with the ref_clk signal and for locking (0.5 µs/(1 µs−1000/985 MHz)*1 µs=33 µs). As seen in FIG. 4, the time period associated with slewing is larger than the time period associated with linear settling. The addition of the time period associated with the slewing approximately triples the total locking time of the frequency synthesizer. In the worst case, the ref_clk and div_clk signals are approximately 360 degrees out of phase during initialization, and the slewing time may be over 70 µs.

Figure 5:
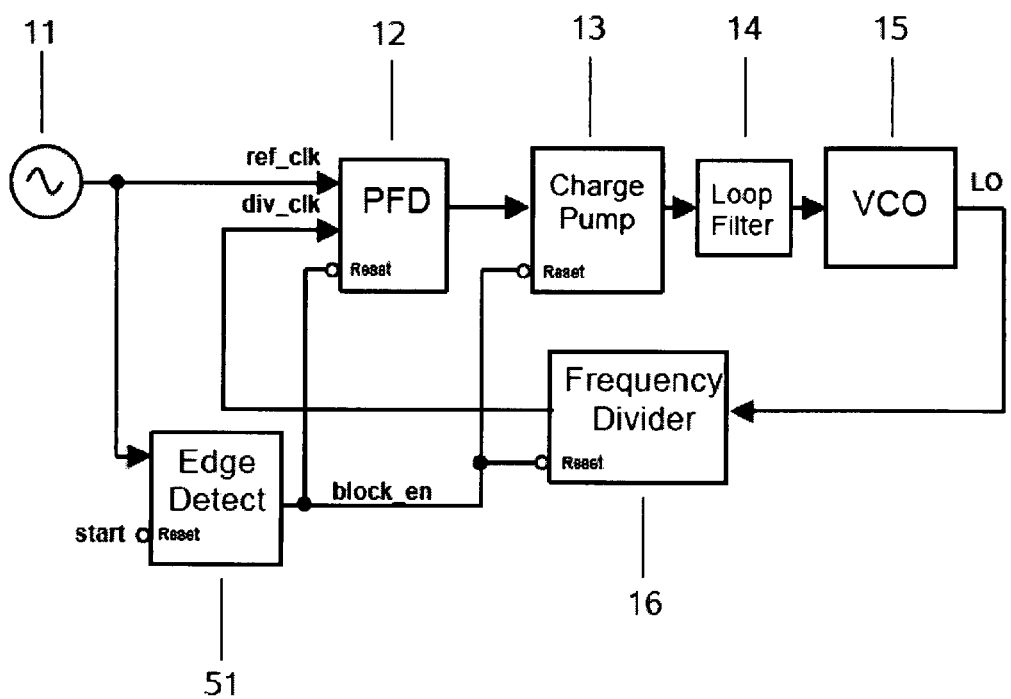
FIG. 5 illustrates an exemplary embodiment of a frequency synthesizer that is consistent with the present invention.

FIG. 5 illustrates an exemplary embodiment of a frequency synthesizer 50 that is consistent with the present invention. The frequency synthesizer 50 includes a PFD 12, a charge pump 13, and a frequency divider 16, which are capable of being reset (or enabled) to allow the control of the starting point of the div_clk signal and of the loop. The frequency synthesizer 50 includes an edge-detection circuit 51. The edge-detection circuit 51 may comprise, for example, a one-shot edge-detection circuit. The edge-detection circuit 51 senses a transition of the ref_clk signal. When the loop is disabled, the start signal (start) and the output signal (block_en) of the edge-detection circuit 51 are low. This resets the PFD 12 and the frequency divider 16, and the output of the charge pump 13 settles to a middle-range constant voltage such as half the supply voltage (VDD/2). When the loop is enabled, the start signal goes high and brings the edge-detection circuit 51 out of reset. When a low-to-high transition is made by the ref_clk signal, the block_en signal goes high, which enables the PFD 12, the charge pump 13 and the frequency divider 16. Ideally, the rising edge of the div_clk signal is a distance less than 1 divided by the local-oscillator frequency away from the first rising edge of the ref_clk signal. This is significantly shorter than 1 over the ref_clk frequency, which is the case for prior art frequency synthesizers.

Figure 6:
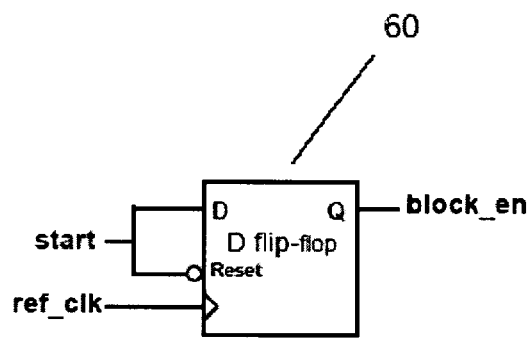
FIG. 6 illustrates an example of an edge-detection circuit that is consistent with the present invention.

FIG. 6 illustrates an example of an edge-detection circuit 60 that is consistent with the present invention. The edge-detection circuit 60 is a D-flip-flop (D-FF). The reset and the input D of the edge-detection circuit 60 are connected as the start signal. The ref_clk signal acts as the triggering clock signal. When the start signal is low, the D-FF is reset and its output Q is low. When the start signal goes high, the output Q goes high once the ref_clk signal goes from low to high.

Figure 7:
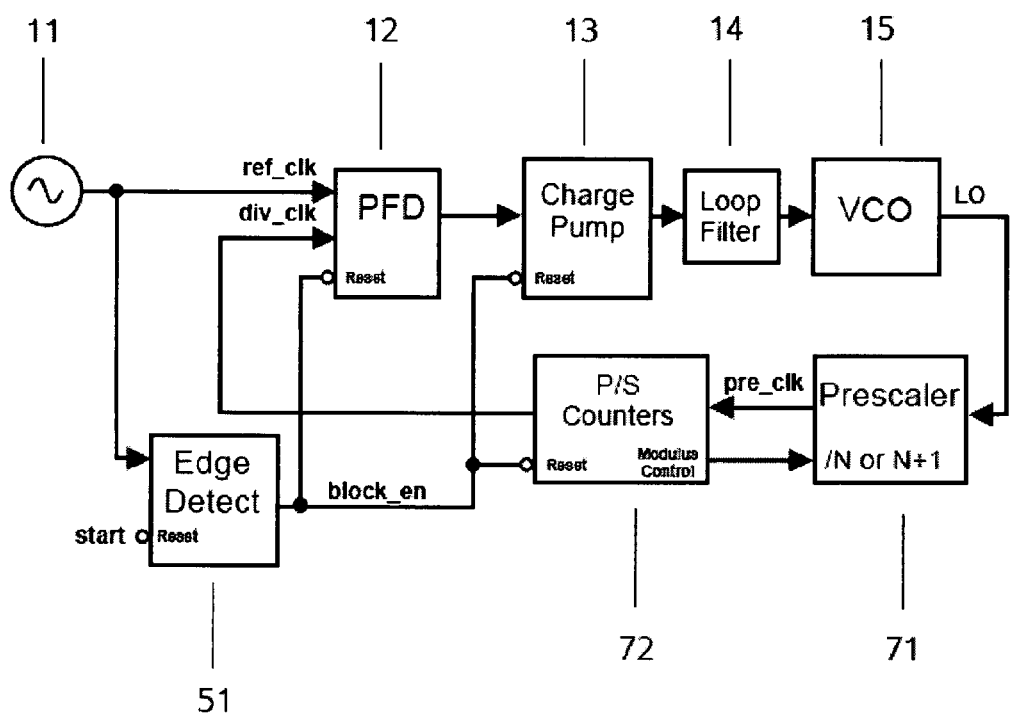
FIG. 7 illustrates a second exemplary embodiment of a frequency synthesizer that is consistent with the present invention.

FIG. 7 illustrates a second exemplary embodiment of a frequency synthesizer 70 that is consistent with the present invention. For this frequency synthesizer 70, the frequency divider has been separated into a prescaler 71 and program/swallow (P/S) counters 72. The prescaler 71 operates at a high frequency. Therefore, it consists mainly of analog circuits. Turning the prescaler 71 on and off may require a long settling time, which would introduce a delay. Therefore, in this embodiment, the reset control is applied only to the P/S counters 72. As a result, the maximum delay between the first edges of the ref_clk and div_clk signals is 1 divided by the prescaler-clock signal (pre_clk), which is significantly smaller than 1 over the ref_clk signal.

Figure 8:
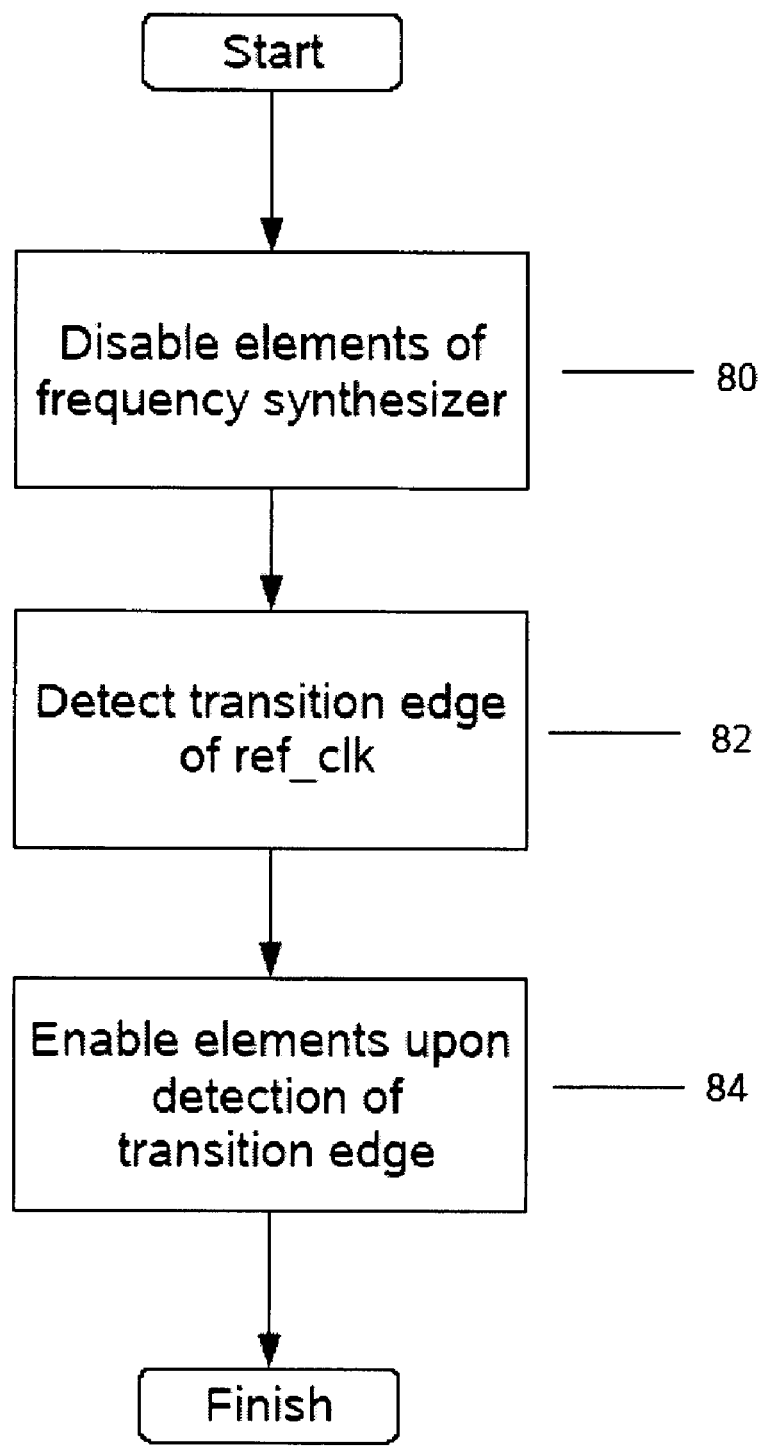
FIG. 8 is a flowchart that illustrates exemplary steps of a method that is consistent with the present invention.

FIG. 8 is a flowchart that illustrates exemplary steps of a method of starting a frequency synthesizer that is consistent with the present invention. In step 80, certain elements of the frequency synthesizer are disabled. The disabled elements may include, for example, the PFD, charge pump and frequency divider or the PFD, charge pump and P/S counters. In step 82, a transition edge of the ref_clk signal is detected. The transition edge may be, for example, the leading edge or the trailing edge of the ref_clk signal. In step 84, the disabled elements of the frequency synthesizer are enabled at substantially the same time that the transition edge of the ref_clk signal is detected.

Although embodiments of the invention have been discussed primarily with respect to specific embodiments thereof, other variations are possible. Various frequency-synthesizer configurations may be used in place of, or in addition to, the one presented herein. In addition, steps may be performed by hardware or software, as desired. Note that steps can also be added to, taken from or modified from the steps in this specification without deviating from the scope of the invention. In general, any flowcharts presented are only intended to indicate one possible sequence of basic operations to achieve a function, and many variations are possible. Those of skill in the art will also appreciate that methods and systems consistent with the present invention are suitable for use in a wide range of applications, such as radio-frequency identification (RFID) and other information-processing systems and GSM, GPRS and WCDMA and other communications systems.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention.

What is claimed is:

1. A method of starting a frequency synthesizer that includes a program/swallow counter and a prescaler, comprising:
   disabling elements, including the program/swallow counter and not the prescaler, of said frequency synthesizer prior to starting said frequency synthesizer;
   detecting a transition edge of a reference-clock signal of said frequency synthesizer; and
   enabling the disabled elements of said frequency synthesizer substantially upon detection of said transition edge.

2. The method of claim 1 wherein said elements of said frequency synthesizer comprise a phase-frequency detector and a charge pump.

3. The method of claim 1 wherein said transition edge comprises a low-to-high transition of said reference-clock signal.

4. The method of claim 1 wherein said transition edge comprises a high-to-low transition of said reference-clock signal.

5. A frequency synthesizer that includes a program/swallow counter and a prescaler, comprising:
   means for disabling elements, including the program/swallow counter and not the prescaler, of said frequency synthesizer prior to starting said frequency synthesizer;
   means for detecting a transition edge of a reference-clock signal of said frequency synthesizer; and
   means for enabling the disabled elements of said frequency synthesizer substantially upon detection of said transition edge.

6. The frequency synthesizer of claim 5 wherein said elements of said frequency synthesizer comprise a phase-frequency detector and a charge pump.

7. The frequency synthesizer of claim 5 wherein said transition edge comprises a low-to-high transition of said reference-clock signal.

8. The frequency synthesizer of claim 5 wherein said transition edge comprises a high-to-low transition of said reference-clock signal.

9. The frequency synthesizer of claim 5 wherein said means for detecting a transition edge of a reference-clock signal comprises an edge-detection circuit.

10. The frequency synthesizer of claim 9 wherein said edge-detection circuit comprises a D-flip-flop circuit.

11. An information-processing system, comprising;
    a frequency synthesizer including a phase-locked loop that includes a program/swallow counter and a prescaler; and
    an edge-detect circuit for (a) disabling elements, including the program/swallow counter and not the prescaler, of said phase-locked loop prior to staffing said frequency synthesizer; (b) detecting a transition edge of a reference-clock signal of said frequency synthesizer; and (c) enabling the disabled elements of said phase-locked loop of said frequency synthesizer substantially upon detection of said transition edge.

12. The information-processing system of claim 11 wherein said elements of said phase-locked loop comprise a phase-frequency detector and a charge pump.

13. The information-processing system of claim 11 wherein said transition edge comprises a low-to-high transition of said reference-clock signal.

14. The information-processing system of claim 11 wherein said transition edge comprises a high-to-low transition of said reference-clock signal.

15. The information-processing system of claim 11 wherein said information processing system comprises a radio-frequency identification system.

16. The information-processing system of claim 11 wherein said information processing system comprises a communications system.

* * * * *